(12) United States Patent
Matteson

(10) Patent No.: US 6,434,004 B1
(45) Date of Patent: Aug. 13, 2002

(54) HEAT SINK ASSEMBLY

(75) Inventor: Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/687,613

(22) Filed: Oct. 11, 2000

(51) Int. Cl.7 .................................................. H05K 7/20
(52) U.S. Cl. ...................... 361/704; 165/80.3; 174/16.3; 257/718; 257/719; 257/727; 361/710; 361/719; 361/720; 24/458; 248/510
(58) Field of Search ................................ 165/80.2, 80.3, 165/185; 174/16.3; 257/706–707, 712–713, 718–719, 726–727; 361/690, 704, 707, 709–710, 719–720; 248/505, 510; 24/457–458

(56) References Cited

U.S. PATENT DOCUMENTS

| | | | |
|---|---|---|---|
| 4,593,342 A | 6/1986 | Lindsay | |
| 5,570,271 A | 10/1996 | Lavochkin | |
| 5,730,210 A | 3/1998 | Kou | |
| 5,804,875 A | 9/1998 | Remsburg et al. | |
| 5,818,695 A | 10/1998 | Olson | |
| 5,842,512 A | 12/1998 | Guerrero | |
| 5,847,928 A | 12/1998 | Hinshaw et al. | |
| 5,870,288 A | 2/1999 | Chen | |
| 5,884,692 A | 3/1999 | Lee et al. | |
| 5,886,871 A | 3/1999 | Jeffries et al. | |
| 5,886,873 A | 3/1999 | Ahn | |
| 5,959,350 A | 9/1999 | Lee et al. | |
| 5,973,921 A | 10/1999 | Lin | |
| 5,990,552 A | 11/1999 | Xie et al. | |
| 5,991,152 A | 11/1999 | Chiou | |
| 6,035,523 A | 3/2000 | McNeil et al. | |
| 6,205,026 B1 * | 3/2001 | Wong et al. | 257/719 |
| 6,243,265 B1 * | 6/2001 | Wong et al. | 361/704 |
| 6,250,375 B1 * | 6/2001 | Lee et al. | 257/719 |

* cited by examiner

Primary Examiner—Gregory Thompson
(74) Attorney, Agent, or Firm—Sawyer Law Group L.L.P.

(57) ABSTRACT

A heat sink assembly in accordance with the present invention is disclosed. The assembly comprises a heat sink and at least one clip coupled to the heat sink via a plurality of two features. The plurality of features allow for alignment of the clip to the heat sink. The at least one clip further includes a plurality of legs. Thereby, a tool is not required to couple the clip to the heat sink. A heat sink to circuit board assembly is provided which in a preferred embodiment utilizes two clips affixed to the heat sink. The heat sink in a preferred embodiment includes two protruding features which allow for the alignment and engagement of the two clips therewith. These features allow for ease of assembly of the heat sink to the clip without requiring a tool. The heat sink is then aligned over a chip located on the circuit board, the legs are then extended through the circuit board allowing for rigid assembly and grounding.

8 Claims, 4 Drawing Sheets

HEAT SINK ASSEMBLY

FIELD OF THE INVENTION

The present invention relates generally to securing an electronic component to a printed circuit board (PCB) and more specifically to a system which utilizes a heat sink and a clip assembly for mounting an integrated circuit to a PCB.

BACKGROUND OF THE INVENTION

Cooling of electrical components which are mounted on a circuit board is becoming more and more complex. The power dissipated by processing systems such as NetFinity server systems, by IBM Corporation, are increasing, while the circuit size is remaining constant. This drives up the heat flux, the heat per unit area. As this happens, the heat sink solution becomes that much more critical. While these thermal solutions are challenging, we have simultaneous design challenges ensuring heat sink solutions are designed for manufacturing and assembly.

Past support chip solutions required an epoxy interface or double sided pressure sensitive adhesive (PSA) interface materials to hold the heat sinks to the chips. Both these solutions have disadvantages associated with them. The epoxy allows for only one time assembly, and the thermal characteristics are better than double-sided PSA interface materials. The interface material not only has degraded thermal characteristics with the PSA material, but also has reliability issues with assembly integrity.

In addition, since the electronic components are running hotter, the heat sinks required must be larger. For example, the size of the typical conventional heat sink was 15 mm×15 mm; now with components running at a higher temperature, the size of the heat sinks is now as large as 42 mm×42 mm. Accordingly, the epoxy and double sided PSA material solutions do not effectively secure the heat sink to a component at these sizes.

Accordingly, what is needed is a system and method for providing an effective heat sink for integrated circuits as well as being able to securely mount and secure integrated circuits to the circuit board. The system must be cost effective, easy to implement and adaptable for use on existing printed circuit boards. The present invention addresses such a need.

SUMMARY OF THE INVENTION

A heat sink assembly in accordance with the present invention is disclosed. The assembly comprises a heat sink and at least one clip coupled to the heat sink via a plurality of two features. The plurality of features allow for alignment of the clip to the heat sink. The at least one clip further includes a plurality of legs. Thereby, a tool is not required to couple the clip to the heat sink.

A heat sink to circuit board assembly is provided which in a preferred embodiment utilizes two clips affixed to the heat sink. The heat sink in a preferred embodiment includes two protruding features which allow for the alignment and engagement of the two clips therewith. These features allow for ease of assembly of the heat sink to the clip without requiring a tool. The heat sink is then aligned over a chip located on the circuit board, the legs are then extended through the circuit board allowing for rigid assembly and grounding.

DETAILED DESCRIPTION

The present invention relates generally to securing an electronic component to a printed circuit board (PCB) and more specifically to a system which utilizes a heat sink and a clip assembly for mounting an integrated circuit coupled to a PCB. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A system and method in accordance with the present invention allows for ease of assembly of heat sinks to planar boards. Accordingly, during production the heat sink assembly can be quickly assembled to the PCB, but also allows for advanced interface materials to be used. A heat sink to circuit board assembly is provided via two retention clips which are permanently affixed to the heat sink. The heat sink in a preferred embodiment includes two protruding features which allow for the alignment and engagement of the two clips therewith. These features allow for ease of assembly of the heat sink to the clip without requiring a tool. The heat sink is then aligned over a chip located on the circuit board, the legs are then extended through the circuit board allowing for rigid assembly and EMC grounding. The snap feature of the clip to heat sink assembly allows for ease of locating and assembly to the PCB. The grounding by means of clip attach to the underside of the PCB via grounding pads on the bottom side.

Figure 1:
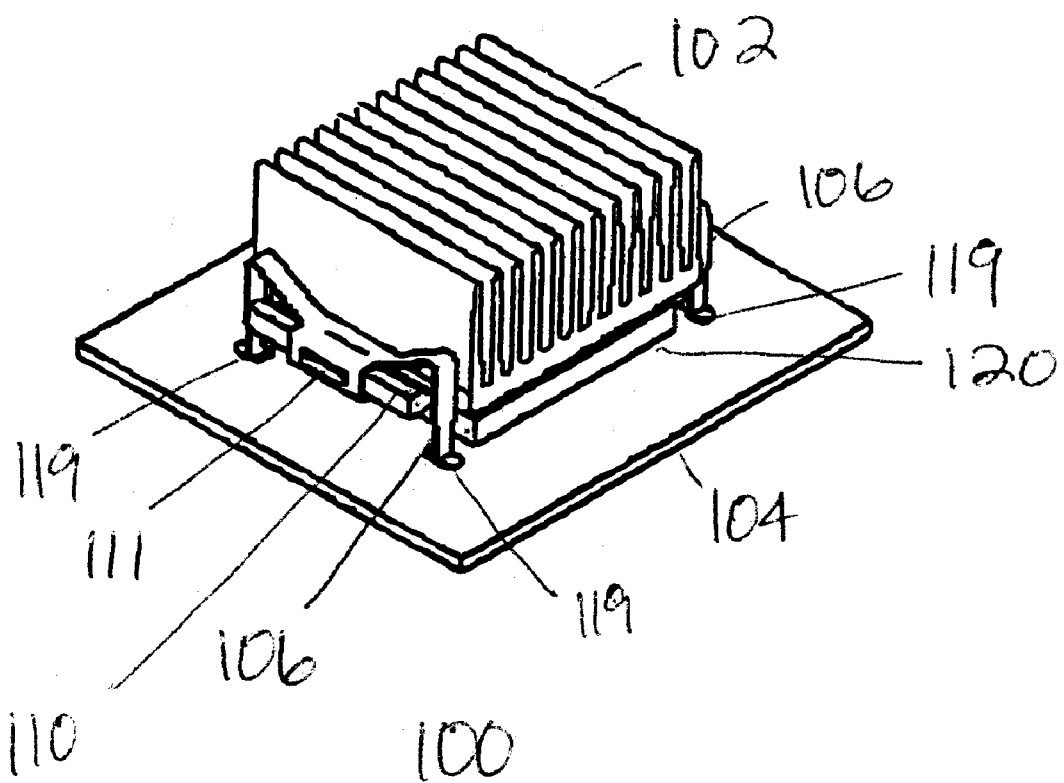
FIG. 1 is a perspective view illustrating a heat sink/clip assembly mounted on a board.
Figure 1A:
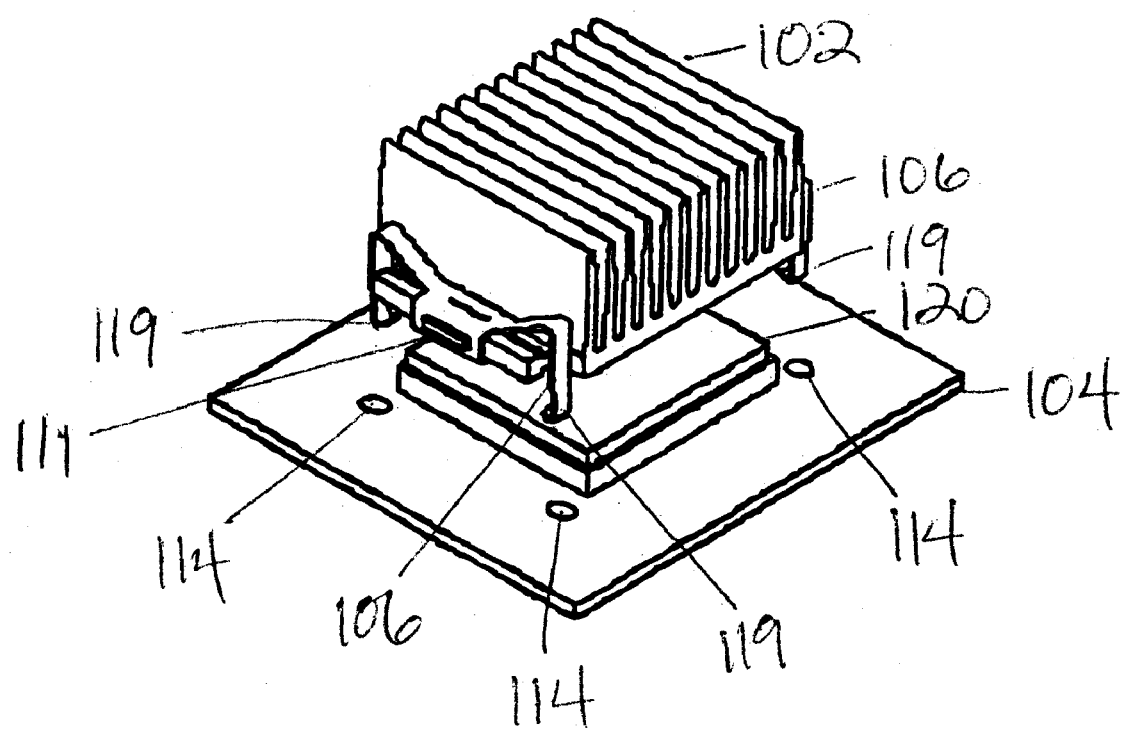
FIG. 1a illustrates the heat sink and clip before assembled to the board.
Figure 2:
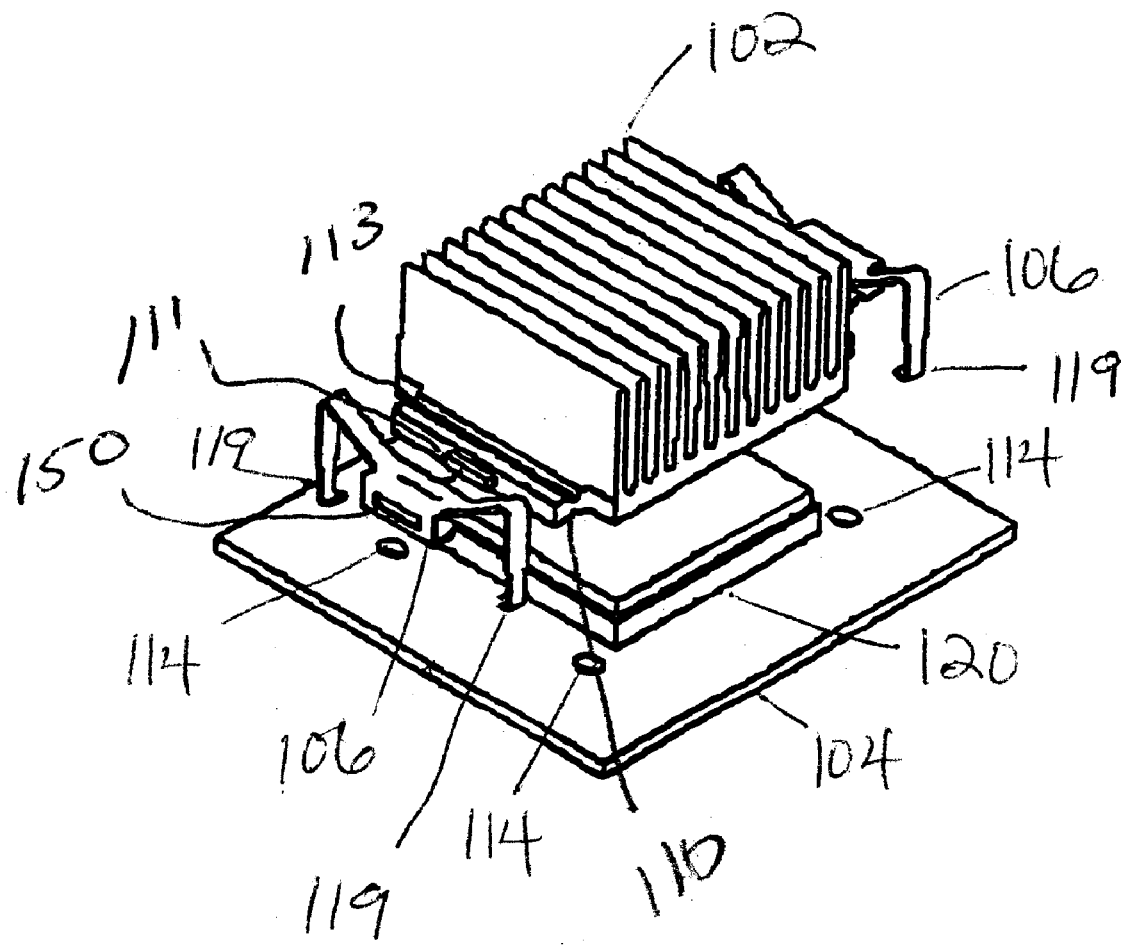
FIG. 2 is an exploded view of the heat sink/clip assembly of FIG. 1.
Figure 3:
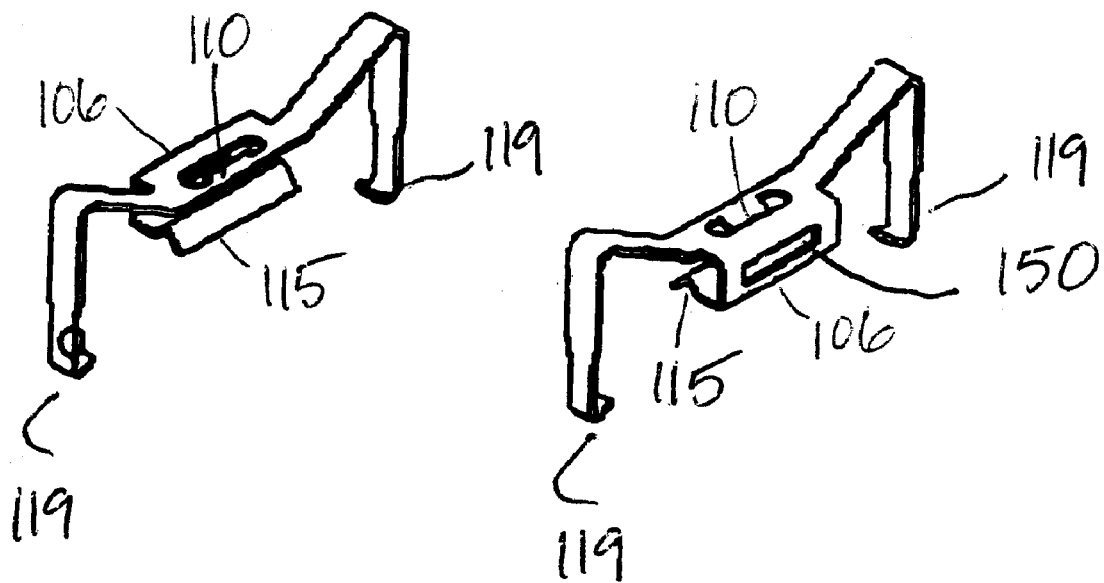
FIG. 3 are views of the two clips of the part of the clip assembly of FIGS. 1 and 2.

To describe the features of the present invention in more detail, refer now to the following descriptions in conjunction with the accompanying Figures. FIG. 1 is a perspective view illustrating a heat sink clip assembly 100 in accordance with the present invention mounted on a board. In this embodiment a heat sink 102 which is in engagement with a component 120 is assembled to a planar board 104 via a pair of stainless spring clips 106. FIG. 1a illustrates the heat sink 102 and clips 106 before being assembled to the board 104. FIG. 2 is an exploded view of the heat sink/clip assembly 100 of FIG. 1. FIG. 3 are views of the two clips 106 of the heat sink assembly of FIGS. 1 and 2. The clips 106 snap over the ends 110 of the heat sink 102 in order to from a single uniform assembly.

Referring to FIGS. 1a and 3 together, the clips 106 engage and are coupled to the ends 110 of the heat sink 102 through the use of a protruding feature 111 on the heat sink which engages an opening 150 on the clip and a groove 113 which engages a tab portion 112 of the clip. The clip 106 engages the end via a leveled surface 115 on the clip 106. This assembly is therefore provided without requiring a tool for installation. The heat sink 102 and clip 106 assembly is then aligned over the component 120 and the legs 119 of clips 106 are pushed through the holes 114 in the board 104. The legs 119 of the clips 106 then snap to the under side of the board 104. This assembly can also be performed without the use of a tool. This attachment methodology not only allows for advanced interface materials to be used on the heat sink 106, but also allows for increase in grounding provided thereby.

Accordingly, in a system and method in accordance with the present invention, assembly of the clip to the heat sink can be performed without the use of a tool. In addition, the assembly of heat sink/clip assembly to the planar board can also be performed without a tool. Advanced interface materials can be attached to the heat sink while maintaining reliable rigid assembly of assembly to a board. Through the use of a system in accordance with the present invention, force on component is evenly distributed, which is critical to thermal solution while using as few components as possible. In addition, grounding can be provided via board backside grounding pads. Accordingly, the heat/sink clips assembly in accordance with the present invention provides for low cost solution.

Although the present invention has been described in accordance with the embodiments shown, one of ordinary skill in the art will readily recognize that there could be variations to the embodiments and those variations would be within the spirit and scope of the present invention. For example, two clips are utilized at the ends of the heat to secure the heat sink to the board, one of ordinary skill in the art recognizes any number of clips could be utilized and their use would be within the spirit and scope of the present invention. Accordingly, many modifications may be made by one of ordinary skill in the art without departing from the spirit and scope of the appended claims.

What is claimed is:

1. An assembly comprising:

a heat sink; and at least one clip coupled to the heat sink via a plurality of two features, the plurality of two features including a protruding feature on an end position of the heat sink, which engages an opening in the at least one clip, and a groove on the heat sink which engages a tab portion on the at least one clip, wherein the plurality of features allow for alignment of the at least one clip to the heat sink, the at least one clip further including a plurality of legs; wherein a tool is not required to couple the clip to the heat sink.

2. The assembly of claim 1 wherein the at least one clip comprises first and second clips coupled on opposite ends of the heat sink.

3. The assembly of claim 1 wherein the legs engage a circuit board for attachment of the assembly thereto.

4. A circuit board assembly comprising:

a circuit board;

a component coupled to the circuit board; and a heat sink assembly in contact with the component; the heat sink assembly comprising:

a heat sink; and at least one clip coupled to the heat sink via a plurality of two features, the plurality of two features including a protruding feature on an end position of the heat sink, which engages an opening in the at least one clip and a groove on the heat sink which engages a tab portion on the at least one clip, wherein the plurality of features allow for alignment of the at least one clip to the heat sink, the at least one clip further including a plurality of legs; wherein a tool is not required to couple the at least one clip to the heat sink.

5. The circuit board assembly of claim 4 wherein the at least one clip comprises first and second clips coupled on opposite ends of the heat sink.

6. The circuit board assembly of claim 4 wherein the legs engage the circuit board for attachment of the heat sink assembly thereto.

7. An assembly comprising:

a heat sink; and first and second clips coupled to the heat sink via a plurality of features, the plurality of features allowing for alignment of the first and second clips to the heat sink, wherein the plurality of features includes a protruding feature on an end position of the heat sink which engages an opening in each of the first and second clips and a groove on the heat sink which engages a tab portion on each of the first and second clips, the first and second clips further including a plurality of legs, wherein the legs of each of the first and second clips engage a circuit board for attachment of the assembly thereto, wherein a tool is not required to couple the first and second clips to the heat sink.

8. A circuit board assembly comprising:

a circuit board;

a component coupled to the circuit board; and a heat sink assembly in contact with the component and coupled to the circuit board; the heat sink assembly comprising:

a heat sink; and first and second clips coupled to opposite ends of the heat sink via a plurality of features, the plurality of features including a protruding feature on an end position of the heat sink which engages an opening in each of the first and second clips and a groove on the heat sink which engages a tab portion on each of the first and second clips, wherein the plurality of features allow for alignment of the first and second clips to the heat sink, the first and second clips further including a plurality of legs, wherein the legs engage the circuit board for attachment of the heat sink assembly thereto, wherein a tool is not required to couple the first and second clips to the heat sink.

* * * * *